United States Patent
Peretti et al.

(10) Patent No.: US 9,829,540 B2
(45) Date of Patent: Nov. 28, 2017

(54) METHOD AND CONTROLLER FOR DETERMINING AN UNDESIRED CONDITION IN AN ELECTRICAL DRIVE SYSTEM

(71) Applicant: ABB Schweiz AG, Baden (CH)

(72) Inventors: Luca Peretti, Järfälla (SE); Mehanathan Pathmanathan, Västerås (SE); Omer Ikram Ul Haq, Surahammar (SE); Subrat Sahoo, Västerås (SE)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 15/157,644

(22) Filed: May 18, 2016

(65) Prior Publication Data

US 2016/0356854 A1 Dec. 8, 2016

(30) Foreign Application Priority Data

Jun. 8, 2015 (EP) ..................................... 15170998

(51) Int. Cl.
*G01R 31/34* (2006.01)
*G01M 5/00* (2006.01)
(Continued)

(52) U.S. Cl.
CPC ........... *G01R 31/34* (2013.01); *G01M 5/0066* (2013.01); *G01M 13/028* (2013.01); *G01M 13/045* (2013.01)

(58) Field of Classification Search
CPC .... G01R 31/34; G01R 31/343; G01R 31/346; G01R 31/26; G01R 31/2642; G01R 31/2648; G01R 31/2831; G01R 31/31702
See application file for complete search history.

(56) References Cited

U.S. PATENT DOCUMENTS 4,518,964 A * 5/1985 Hetyei ............... G01R 29/0276
                                                   342/202
6,351,713 B1    2/2002 Board et al.
(Continued)

FOREIGN PATENT DOCUMENTS

DE    102011117468 A1    5/2013
EP       2743669 A1      6/2014
(Continued)

OTHER PUBLICATIONS

Extended European Search Report Application No. EP 15170998.7 Completed: Nov. 5, 2015; dated Nov. 20, 2015 14 pages.

*Primary Examiner* — Tung X Nguyen
(74) *Attorney, Agent, or Firm* — Whitmyer IP Group LLC

(57) ABSTRACT

A method for determining an undesired condition in an electrical drive system including an electrical machine and an electrical drive, wherein the method includes a) obtaining a measured signal of an electrical or mechanical parameter, b) obtaining a frequency spectrum of the measured signal, that contains a measured frequency component, c) determining whether the measured frequency component is within a predetermined distance from a trend line, which trend line is associated with only one specific frequency component of the electrical or mechanical parameter present during a specific undesired condition, d) on the condition that the measured frequency component is within the predetermined distance from the trend line increasing a counter associated with the trend line, e) repeating steps a) to d), wherein in case the counter reaches a predetermined number determining that the electrical drive system is subjected to the undesired condition associated with the trend line.

11 Claims, 3 Drawing Sheets

(51) Int. Cl.
*G01M 13/02* (2006.01)
*G01M 13/04* (2006.01)

(56) References Cited

U.S. PATENT DOCUMENTS

| | | | |
|---|---|---|---|
| 6,507,789 B1 | 1/2003 | Reddy et al. | |
| 6,853,951 B2 * | 2/2005 | Jarrell | G05B 23/0283 702/181 |
| 2004/0227524 A1 * | 11/2004 | Kesil | G01B 7/105 324/635 |
| 2014/0365411 A1 | 12/2014 | Beigi et al. | |

FOREIGN PATENT DOCUMENTS

| | | |
|---|---|---|
| NO | 2011114006 A1 | 9/2011 |
| WO | 2012048225 A1 | 4/2012 |
| WO | 2013180723 A1 | 5/2013 |

\* cited by examiner

METHOD AND CONTROLLER FOR DETERMINING AN UNDESIRED CONDITION IN AN ELECTRICAL DRIVE SYSTEM

TECHNICAL FIELD

The present disclosure generally relates to electrical drive systems, i.e. systems comprising an electrical machine and an electrical drive. In particular it relates to a method and to a controller for determining an undesired condition in an electrical drive system.

BACKGROUND

Condition monitoring in electrical drives is usually obtained by means of external devices, i.e. hardware modules. These devices are installed in the plant along with the frequency converter, performing the analysis of the installation with their own sensors and software algorithms.

In some cases, the plant system is connected to a storage device where the important data are gathered for e.g. further post-processing and trending. These operations are usually performed non-real-time and in a passive manner in offline analysis on a separate computer, by exploiting time or frequency or time-frequency analysis of the data.

WO2011114006 A1 discloses a method for condition monitoring of electric and mechanical drives. The measurement data in the condition monitoring system of electric drives is collected at least from one electric drive. The measurement data is pre-treated and a frequency spectrum is created from the pre-treated measurement data with the Fast Fourier Transform and the detected vibration frequency and vibration amplitude are recorded from the frequency spectrum. The detected vibration frequency and vibration amplitude are compared to at least one detected vibration frequency and vibration amplitude successive in time. In the comparison, detrimental changes in vibration frequency and vibration amplitude are defined, and the detrimental changes are indicated.

The practice of offline condition monitoring does not allow a quick response to undesired conditions compared to a real-time-based monitoring system. This is due to the amount of time required to process the data, and the periodicity involved in the data acquisition process.

U.S. Pat. No. 6,507,789 discloses a gear transmission monitoring method. The method includes forming a good operating condition baseline matrix by, for each of a plurality of different gear mesh frequencies, obtaining a good operating condition signal indicative of gear transmission conditions over a segment of time and transforming the obtained good operating condition signal into a good operating condition time-frequency spectrum; and then obtaining a gear mesh frequency and a test signal over a segment of time, transforming the obtained test signal into a test time-frequency spectrum, and using the gear mesh frequency and the good operating condition baseline matrix to examine the test time-frequency spectrum to monitor gear transmission conditions.

SUMMARY

In view of the above, an object of the present disclosure is to solve, or at least mitigate, the problems of the prior art.

Hence, according to a first aspect of the present disclosure there is provided a method for determining an undesired condition in an electrical drive system comprising an electrical machine and an electrical drive, wherein the method comprises:
  a) obtaining a measured signal of an electrical or mechanical parameter concerning the electrical drive system,
  b) obtaining a frequency spectrum of the measured signal, which frequency spectrum contains a measured frequency component,
  c) determining whether the measured frequency component is within a predetermined distance from a trend line, which trend line is associated with only one specific frequency component of the electrical or mechanical parameter present during a specific undesired condition,
  d) on the condition that the measured frequency component is within the predetermined distance from the trend line, increasing a counter associated with the trend line,
  e) repeating steps a) to d), wherein in case the counter reaches a predetermined number within a predetermined number of iterations of steps a) to d),
  f) determining based on that the counter reaches the predetermined number that the electrical drive system is subjected to the undesired condition associated with the trend line.

The method provides on-line monitoring capabilities, leading to a quick reaction to undesired conditions, resulting in a potential reduction of the maintenance overhead of the installation. The method can furthermore potentially be used as a tool for proactive maintenance.

With an undesired condition is meant a failure condition, i.e. a malfunctioning, or a condition which in time potentially may lead up to a failure condition.

One embodiment comprises utilising the Mahalanobis distance in step c) to determine a distance between the measured frequency component and the trend line to determine whether the measured frequency component is within the predetermined distance from the trend line. If a measured frequency component lies on or close to a trend line, the Euclidean distance can yield the same distance for the points which are on the trend line and those which are away from it, because it is calculated using the mean of the trend line without considering the distance of the trend line itself. The Mahalanobis distance is an enhanced form of the Euclidean distance. It uses a covariance matrix to include the trend of a plurality of points for a certain undesired condition according to existing knowledge of frequency component characteristics for various undesired conditions. Each point has as its coordinates the measured frequency of a measurement signal and an associated frequency component, i.e. harmonic. The covariance matrix generalises the notion of variance to multiple dimensions; in the present case to two dimensions. The variation of a group of points of a trend line in two-dimensional space cannot be fully categorised by a single number; a 2×2 matrix is necessary to fully characterise the two-dimensional variation.

According to one embodiment the frequency spectrum is obtained by means of a Fourier transform.

According to one embodiment the frequency spectrum is obtained by means of a Fast Fourier Transform.

According to one embodiment the frequency spectrum is obtained by means of the Sparse Fast Fourier Transform. It has been realised by the inventors that the measurable signals typically utilised for undesired condition detection of an electrical drive system contain relatively few frequency components, and that therefore a sparse frequency transform may be utilised for frequency spectrum analysis. A sparse signal is defined as a signal which has a Discrete Fourier Transform (DFT) where the majority of Fourier coefficients have values which are close to or equal to zero. The spectrum of such a signal will therefore contain a small number of peaks. A sparse frequency transform is suitable for sparse signals as it does not provide a mapping from the time domain to potentially every frequency within a particular range in the frequency domain; a sparse frequency transform is able to map a function from the time domain to some frequencies but not to all frequencies in the frequency domain. The Sparse Fast Fourier Transform (SFFT) has better computational requirements than regular FFT; in particular it reduces the number of computations to the order of O(log n*sqrt(nk*log n)), where, where n is the number of samples in a sample time window and k is the sparsity of the signal, meaning the number of non-zero frequencies in its spectrum. The regular FFT has an order of n*log(n) instead. It has been found that the SFFT is sufficient for decision-making regarding undesired conditions, especially if combined with the Mahalanobis distance.

The Mahalanobis distance and a frequency transform in the Fast Fourier Transform (FFT) family of frequency transforms, e.g. SFFT, act in a synergistic manner as will be described in the following. The frequency resolution $\Delta f$ of the frequency transforms in the FFT family is equal to the inverse of the duration time of the time window $T_w$, i.e. $\Delta f = 1/T_w$. Thus the smaller the time window, the worse is the frequency resolution of the FFT. The possible size of the time window is dependent of the size of available memory of the controller performing the method. Thus, in case there is only a small available amount of memory, which is common, the frequency resolution will be coarse. A coarse frequency resolution will result in inexact measured frequency component determination, which in turn is used to determine whether it belongs to a certain trend line and thus to determine whether an undesired condition is present. Even if the measured frequency component differs from the actually present frequency component the Mahalanobis distance will create an upper and lower threshold on both sides of the trend line, a "bubble", wherein any measured frequency component within this bubble will be determined to belong to be close enough to the trend line. Hence, the uncertainty of the frequency of the measured frequency component due to the frequency resolution of the FFT can be corrected or at least made more certain by using the Mahalanobis distance for the measured frequency component.

According to one embodiment the trend line is a linear regression trend line created based on theoretically modelled or experimentally measured specific frequency components for a plurality of operational frequencies of the electrical or mechanical parameter. The frequency spectra of a number of undesired conditions are well-established and have been obtained by theoretical modelling or experimental measurements for various electrical or mechanical parameters during undesired conditions.

According to one embodiment step c) involves determining whether the measured frequency component is within a predetermined distance from a plurality of trend lines, each trend line being associated with a respective specific frequency component of the electrical or mechanical parameter present during a specific undesired condition, wherein in case the measured frequency component is within the predetermined distance from a trend line in step d) the counter of the corresponding trend line is increased.

According to one embodiment in case there are several measured frequency components in the frequency spectrum, performing steps a) to f) for each measured frequency component to thereby determine the undesired condition.

According to a second aspect of the present disclosure there is provided a computer program for determining an undesired condition in an electrical drive system comprising an electrical machine and an electrical drive, wherein the computer program comprises computer code which, when run on a processing unit of a controller, causes the controller to:

a) obtain a measured signal of an electrical or mechanical parameter concerning the electrical drive system,
b) obtain a frequency spectrum of the measured signal, which frequency spectrum contains a measured frequency component,
c) determine whether the measured frequency component is within a predetermined distance from a trend line, which trend line is associated with only one specific frequency component of the electrical or mechanical parameter present during a specific undesired condition,
d) on the condition that the measured frequency component is within the predetermined distance from the trend line, increase a counter associated with the trend line,
e) repeat a) to d), wherein in case the counter reaches a predetermined number within a predetermined number of iterations of a) to d),
f) determine based on that the counter reaches the predetermined number that the electrical drive system is subjected to the undesired condition associated with the trend line.

According to a third aspect of the present disclosure there is provided a computer program product comprising a computer program according to the second aspect, and a storage unit on which the computer program is stored.

According to a fourth aspect of the present disclosure there is provided a controller configured to determine an undesired condition in an electrical drive system comprising an electrical machine and an electrical drive, wherein the controller comprises: a processing unit, a storage unit containing computer code, wherein the computer code when run on the processing unit causes the controller to: a) obtain a measured signal of an electrical or mechanical parameter concerning the electrical drive system, b) obtain a frequency spectrum of the measured signal, which frequency spectrum contains a measured frequency component, c) determine whether the measured frequency component is within a predetermined distance from a trend line, which trend line is associated with only one specific frequency component of the electrical or mechanical parameter present during a specific undesired condition, d) on the condition that the measured frequency component is within the predetermined distance from the trend line, increase a counter associated with the trend line, e) repeat a) to d), wherein in case the counter reaches a predetermined number within a predetermined number of iterations of a) to d), f) determine based on that the counter reaches the predetermined number that the electrical drive system is subjected to the undesired condition associated with the trend line.

According to one embodiment the controller is configured to utilise the Mahalanobis distance to determine a distance between the frequency component and the trend line to determine whether the measured frequency component is within the predetermined distance from the trend line.

According to one embodiment the controller is configured to obtain the frequency spectrum by means of a Fast Fourier Transform.

According to one embodiment the controller is configured to obtain the frequency spectrum by means of the Sparse Fast Fourier Transform.

According to one embodiment the trend line is a linear regression trend line created based on theoretically modelled or experimentally measured specific frequency components for a plurality of operational frequencies of the electrical or mechanical parameter.

Generally, all terms used in the claims are to be interpreted according to their ordinary meaning in the technical field, unless explicitly defined otherwise herein. All references to "a/an/the element, apparatus, component, means, etc. are to be interpreted openly as referring to at least one instance of the element, apparatus, component, means, etc., unless explicitly stated otherwise.

BRIEF DESCRIPTION OF THE DRAWINGS

The specific embodiments of the inventive concept will now be described, by way of example, with reference to the accompanying drawings, in which.

DETAILED DESCRIPTION

Figure 1:
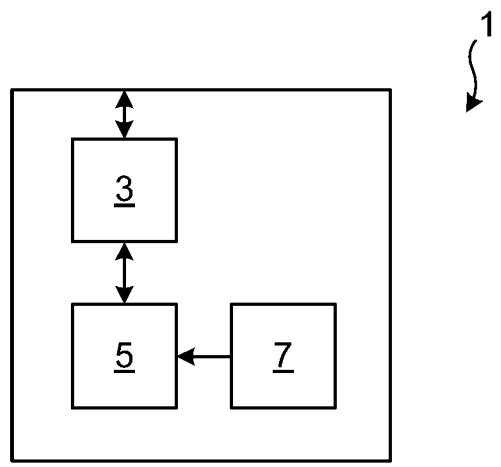
FIG. 1 is a schematic block diagram of a controller configured to determine an undesired condition in an electrical drive system comprising an electrical machine and an electrical drive.

The inventive concept will now be described more fully hereinafter with reference to the accompanying drawings, in which exemplifying embodiments are shown. The inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description.

The present disclosure relates to a method for determining an undesired condition in an electrical drive system comprising an electrical machine and an electrical drive. The electrical machine may be a generator or a motor. The electrical drive may for example be a frequency converter. According to a specific example the electrical machine is a wind turbine generator and the electrical drive is a frequency converter arranged in the nacelle of a wind turbine, configured to control the power output of the wind turbine. It should however be noted that the present method may be utilised in any electrical drive system and not only for wind turbines.

The method may be performed by a controller, for example an electrical drive controller, i.e. the controller which locally controls an electrical drive. Such electrical drive controllers are typically arranged in the electrical drive cabinet of an electrical drive. The method may alternatively be performed by a higher level controller, for example a general or supervisory controller, arranged at another location than the electrical drive.

The method is based on receiving a measured signal of an electrical or mechanical parameter of the electrical drive system, and determining the harmonic content thereof and based on the harmonic content determine the undesired condition. With an electrical or mechanical parameter is herein meant either a pure electrical parameter such as current, a pure mechanical parameter such as mechanical rotation speed of a rotor, or an electromechanical parameter.

The frequency content of the measured signal is determined and based on the frequency content, i.e. frequency components, and by means of previous knowledge of specific frequency components or signature spectra being present for specific faults, an undesired condition can be determined. This is in particular determined by determining a distance of a measured frequency component from a trend line, e.g. a linear regression trend line, preferably measuring the distance from the trend line by means of the Mahalanobis distance. If the measured frequency component is within a predetermined distance of the trend line, it is determined to belong to the trend line in question. This process may be repeated for a plurality of subsequent measurements of the same electrical or mechanical parameter. Each time a measured frequency component is determined to belong to a trend line, i.e. to be within a predetermined distance from the trend line, a counter associated with the trend line in question is increased. If the counter reaches a predetermined number within a predetermined number or tries, it may be determined that the measured frequency component is indeed present in the frequency spectrum of the measured signal. The reliability of the diagnostics may thereby be improved.

The method will now be described in more detail with reference to FIGS. 1 to 6b.

FIG. 1 shows a block diagram of a controller 1 configured to determine an undesired condition in an electrical drive system comprising an electrical machine and an electrical drive. The controller 1 comprises a communication unit 3 configured to receive a measured signal of an electrical or mechanical parameter, storage unit 7 comprising computer code, and a processing unit 5. The controller 1 is configured to perform the method which will be described in more detail in the following when the computer code stored in the storage unit 7 is run on the processing unit 5.

Figure 2:
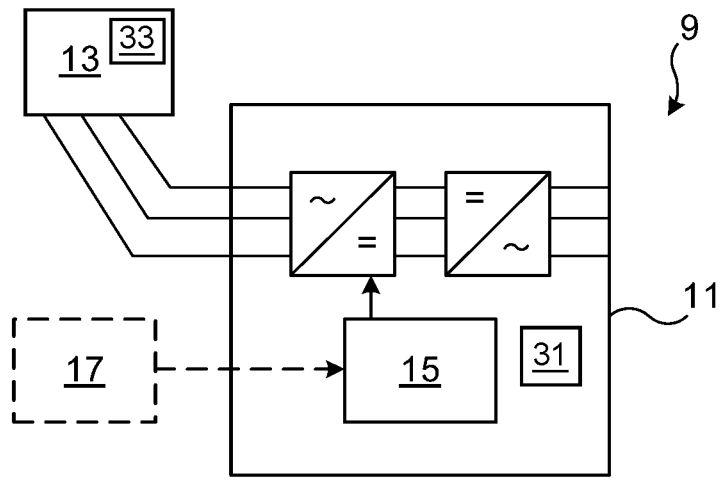
FIG. 2 is a schematic block diagram of an electrical drive system.

FIG. 2 shows a block diagram of an electrical drive system 9 comprising an electrical drive 11 and an electrical machine 13. The electrical drive 11 is electrically connected to the electrical machine 13, and configured to control the power flow in the electrical drive system 9. The electrical drive 11 can be controlled by a local electrical drive controller 15. The electrical drive system 9 may optionally also include a general, or supervisory, controller 17 arranged to provide supervisory control of the electrical drive controller 15, for example in the event that the electrical drive system 9 forms part of a larger electrical power system comprising a plurality of electrical drive systems 9. The controller 1 in FIG. 1 may be the electrical drive controller 15 or the general, or supervisory, controller 17.

The electrical drive system 9 comprises a plurality of sensors, for example current and/or voltage sensors 31 within the electrical drive 11, and speed sensors 33 for measuring the mechanical speed or electrical speed of the electrical machine 13. These sensors are thus arranged to measure electrical or mechanical parameters of the electrical drive system 9. These measured signals form the basis for determining whether an undesired condition is present in the electrical drive system 9, i.e. to perform monitoring and diagnostics of the electrical drive system 9.

Figure 3:
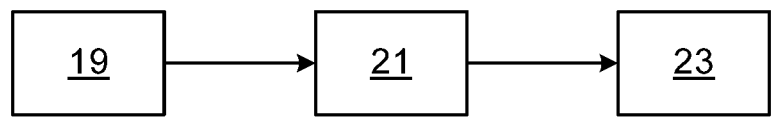
FIG. 3 is a general flow chart depicting aspects of the present disclosure.

In FIG. 3, a general scheme or flowchart describing the diagnostics method according to the present concept is shown. First a frequency analysis of the measured signal is performed, as illustrated by means of box 19. The frequency analysis forms the basis for decision-making, i.e. to determine whether an undesired condition is present and also determining the type of undesired condition, as illustrated by means of box 21. The processes performed in boxes 19 and 21 are the subject of the present disclosure and will be described in detail in what follows. The decision obtained in box 21 is utilised for performing actions like compensation by means of the electrical drive controller 15, i.e. to perform mitigating actions concerning the undesired condition, as symbolically shown by box 23. Suitable compensation, in case a decision of an undesired condition has been taken, is described in detail in EP 2 754 889 A1 and will not be discussed any further herein.

Figure 4:
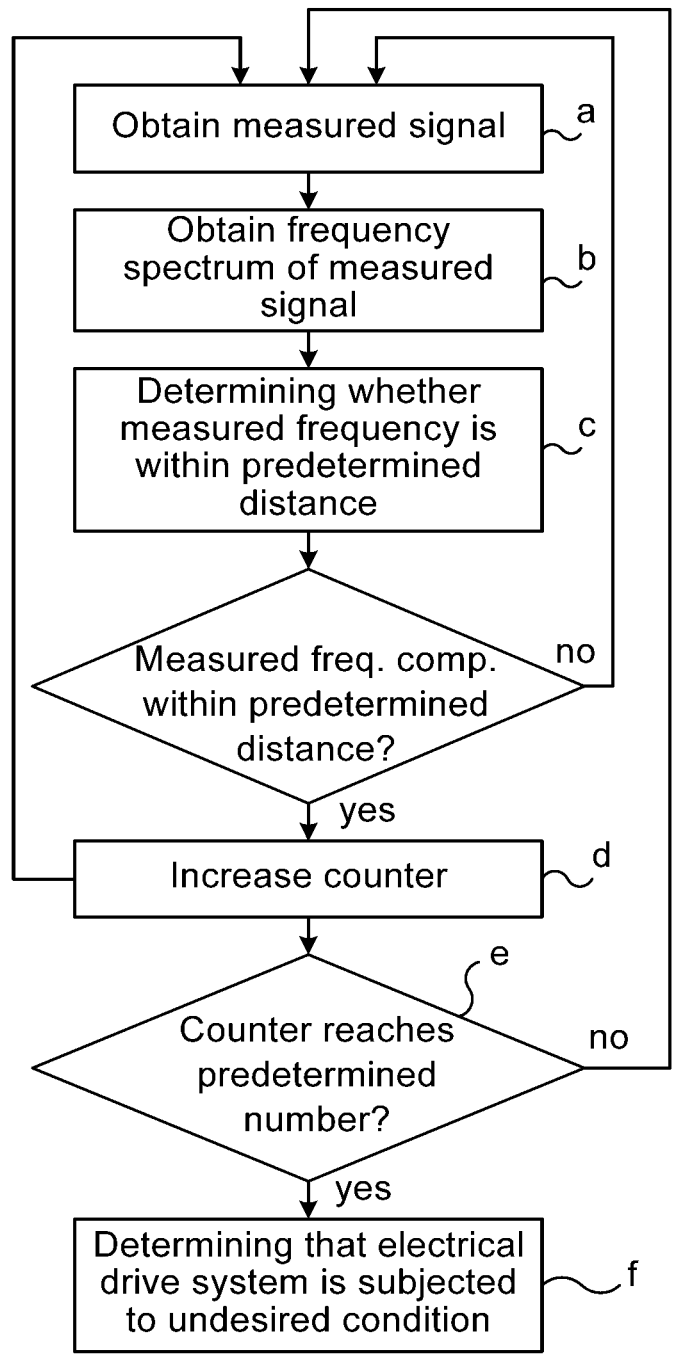
FIG. 4 is a flowchart illustrating a method of determining an undesired condition in an electrical drive system comprising an electrical machine and an electrical drive.

With reference to FIG. 4 a method of determining whether an undesired condition is present in the electrical drive system 9 will now be described.

In a step a) a measured signal of an electrical or mechanical parameter concerning the electrical drive system 9 is obtained by the processing unit 5.

In a step b) a frequency spectrum of the measured signal is obtained by the processing unit 5. The frequency spectrum contains a measured frequency component.

The frequency spectrum in step b) may for example be determined by means of a Fourier transform, preferably an FFT. A suitable example of an FFT, which is a simplified form of the FFT, is the SFFT. Other examples of frequency transforms are FFTW, AAFFT and Wavelets. Adaptive filtering such as adaptive notch filtering could also be used to determine the frequency spectrum.

In a step c) it is determined by means of the processing unit 5 whether the measured frequency component is within a predetermined distance from a trend line. The trend line is associated with only one specific frequency component of the electrical or mechanical parameter present during a specific undesired condition. The trend line may be a linear regression trend line. In case there are several measured frequency components in the frequency spectrum, each measured frequency component is tested whether it belongs to a trend line.

Figure 5:
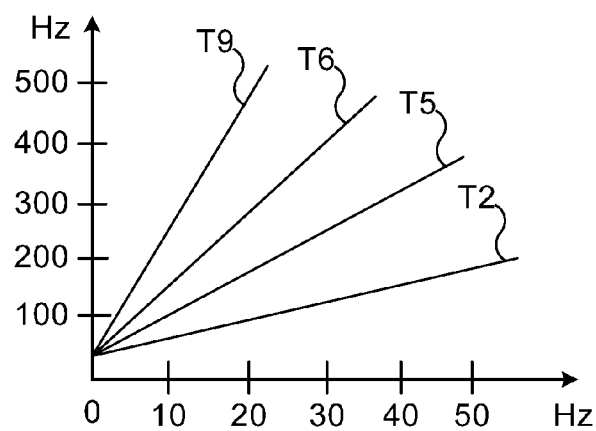
FIG. 5 shows examples of trend lines.

Examples of trend lines T2, T5, T6 and T9 are shown in FIG. 5. Each trend line is associated with a specific harmonic of the frequency of an electrical or mechanical parameter. According to the example, trend line T2 is associated with the second harmonic, trend line T5 with the fifth harmonic, trend line T6 with the sixth harmonic and trend line T9 with the ninth harmonic of a measured signal of the electrical or mechanical parameter. The x-axis is the fundamental frequency, i.e. the actual time-domain frequency of the measured signal and the y-axis is the corresponding frequency component for a particular harmonic, and each trend line is created based on a plurality of fundamental frequencies and corresponding frequency components of the particular harmonic. The distance from such a trend line for a measured frequency component obtained in step b) is thus determined in step c).

Step c) may according to one variation involve utilising the Mahalanobis distance to determine a distance between the measured frequency component and the trend line to determine whether the measured frequency component is within the predetermined distance from the trend line. The distance determined is in particular that between the trend line and a point in the plane which as one coordinate has the value of the measured frequency component and as the other coordinate the actual time-domain frequency of the measured signal. The Mahalanobis distance $d^{mah}$ is defined by equation (1) below.

$$d^{mah}(P,Q) = \sqrt{(P_i - \mu(Q))C^{-1}(Q)(P_i - \mu(Q))^T}, \quad (1)$$

where P is a vector in $\mathbb{R}^2$, i.e. the two-dimensional Euclidean space and which vector P corresponds to the coordinates of the time-domain frequency of the measured signal and the frequency value of the measured frequency component. Q is a matrix with two columns, i.e. coordinates, and a number of rows equal to the number points, i.e. theoretically or experimentally determined pairs of time-domain frequency value and a corresponding frequency component value of a known undesired condition, required to describe a specific harmonic, and the $\mu(Q)$ is the mean of vector Q. $C^{-1}$ is the inverse of a 2×2 covariance matrix C for the points scattered in two-dimensional space from which a trend line for a specific harmonic is generated. The covariance matrix C can be determined by means of equation (2) below.

$$C = \frac{1}{n-1}\Sigma_{i=1}^{n}(Q_i - \mu([Q]))^T \cdot (Q_i - \mu([Q])) \quad (2)$$

The covariance matrix C may be selected based on the frequency resolution of the Fourier transform and on the amount of noise present in the measured signal. This determines the predetermined distance from the trend line, i.e. the size of the bubble that surrounds a trend line.

In a step d) in case the measured frequency component is within the predetermined distance from the trend line, a counter associated with the trend line is increased.

In a step e) steps a) to d) are repeated wherein in case the counter reaches a predetermined number within a predetermined number of iterations of steps a) to d), it is determined that the measured frequency component is indeed included in the frequency spectrum. It can thereby be determined in a step e) that the electrical drive system is subject to the undesired condition associated with the trend line.

Of course, the frequency spectrum may contain a plurality of measured frequency components, in which case the above steps a) to e) are performed for each measured frequency component to determine whether they indeed are present in the frequency spectrum and related to a known undesired condition. Step e) may hence be based on a single or on a plurality of verified measured frequency components, typically dependent of the type of undesired condition. To this end, the controller 1 is configured to perform the steps a)-e) for a plurality of frequency components and to determine the undesired condition based on all of the frequency components and their association with respective trend lines.

Examples of undesired conditions in the case of wind turbines are wind shear, tower shadow and wind turbine tower fore-aft oscillations, each of which may be detected by means of a speed sensor. In these examples, the electrical or mechanical parameter is the mechanical speed of the electrical machine. Wind shear, for example, provides measured frequency components in multiples of three of the fundamental frequency, i.e. of the frequency of the mechanical speed. Since spectral signatures of undesired conditions are well-known, these will not be described herein.

According to one variation, the controller may include an FPGA, wherein the FPGA could be configured to perform the SFFT while the Mahalanobis distance calculation of step c) could be performed by the processing unit 5, e.g. a microprocessor, in parallel with the SFFT.

Figures 6A, 6B:
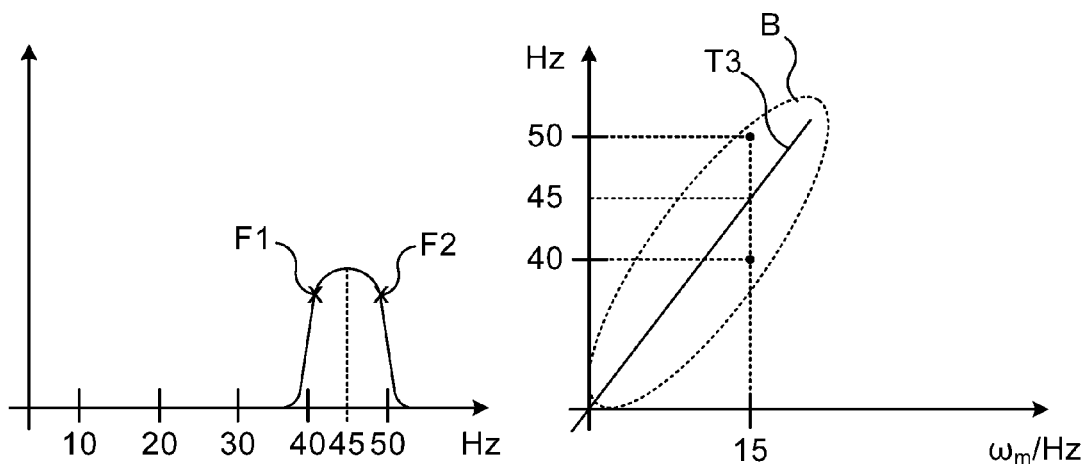
FIGS. 6a and 6b show an example of determining an undesired condition in an electrical drive system.

An example to illustrate the method will now be described in more detail with reference to FIGS. 6a and 6b. According to the example, the electrical drive system forms part of a wind turbine and the mechanical speed $\omega_m$ of the electrical machine 13, a wind turbine generator, is measured by sensors to thereby obtain the measured signal. The electrical or mechanical parameter is hence the mechanical speed $\omega_m$. According to the example, the SFFT is used to determine the frequency spectrum of the measured signal. The mechanical speed $\omega_m$ according to the example is 15 Hz. The third harmonic is hence 45 Hz. According to the example, the sample time window $T_w$ is 0.1 seconds, which leads to a frequency resolution $\Delta f$ of the SFFT equal to the inverse of the sample time window $T_w$, i.e. 10 Hz. This is shown in FIG. 6a; there is no sharp peak at 45 Hz due to the relatively poor frequency resolution. In the exemplified frequency spectrum there are two frequencies F1 and F2 present close to 45 Hz, both e.g. above a predetermined value thus providing an indication of a respective frequency present. These two identified frequencies F1, F2 can preliminarily be seen as two frequency components and are located at 40 Hz and at 50 Hz of the frequency spectrum.

In FIG. 6b, it can be seen that both frequencies, located at 40 Hz and 50 Hz are within the predetermined distance, illustrated by means of a bubble B, from a trend line T3 of the third harmonic of the frequency of the mechanical speed $\omega_m$. It may thus be concluded that both frequencies form a single measured frequency component. In this case a counter may be increased. According to the method, subsequent samples of the measured signal may also be analysed in the same manner, and if the counter reaches a predetermined number within a predetermined number of tries, it can be determined that the frequency components at 40 Hz and 50 Hz indeed are one frequency component, namely the third harmonic of the mechanical speed frequency. In this manner a conclusion concerning an undesired condition may be drawn, especially if further frequency components of the frequency spectrum of the measured signal are analysed in the same manner. For example in the present case, the existence of the third harmonic may give an indication that a tower shadow undesired condition is present.

The inventive concept has mainly been described above with reference to a few examples. However, as is readily appreciated by a person skilled in the art, other embodiments than the ones disclosed above are equally possible within the scope of the inventive concept, as defined by the appended claims.

What is claimed is:

1. A method for determining an undesired condition in an electrical drive system comprising an electrical machine and an electrical drive wherein the method comprises:
    a) Obtaining, with a sensor, a measured signal of an electrical or mechanical parameter concerning the electrical drive system,
    b) Obtaining, with a processing unit, a frequency spectrum of the measured signal by means of the Fast Fourier Transform, which frequency spectrum contains a measured frequency component,
    c) Determining, with the processing unit, whether a point in the plane having as its coordinates a frequency value of the measured frequency component and the fundamental frequency of the measured signal is within a predetermined distance from a trend line, which trend line is associated with only one specific harmonic of the electrical or mechanical parameter present during a specific undesired condition, and utilising the Mahalanobis distance to determine a distance between the point and the trend line to determine whether the point is within the predetermined distance from the trend line,
    d) on the condition that the point is within the predetermined distance from the trend line, increasing a counter associated with the trend line,
    e) repeating steps a) to d), wherein in case the counter reaches a predetermined number within a predetermined number of iterations of steps a) to d),
    f) determining, with the processing unit, based on that the counter reaches the predetermined number that the harmonic associated with the trend line is present in the measured signal and thereby that the electrical drive system is subjected to the undesired condition associated with the trend line.

2. The method as claimed in claim 1, wherein the frequency spectrum is obtained by means of the Sparse Fast Fourier Transform.

3. The method as claimed in claim 1, wherein the trend line is a linear regression trend line created based on theoretically modelled or experimentally measured specific frequency components for a plurality of operational frequencies of the electrical or mechanical parameter.

4. The method as claimed in claim 1, wherein step c) involves determining whether the point is within a predetermined distance from a plurality of trend lines, each trend line being associated with a respective specific harmonic of the electrical or mechanical parameter present during an undesired condition, wherein in case the point is within the predetermined distance from a trend line in step d) the counter of the corresponding trend line is increased.

5. The method as claimed in claim 1, wherein in case there are several measured frequency components in the frequency spectrum, performing steps a) to f) for each measured frequency component to thereby determine the undesired condition.

6. A computer program for determining an undesired condition in an electrical drive system comprising an electrical machine and an electrical drive wherein the computer program comprises computer code stored on non-transitory computer readable media which, when run on a processing unit of a controller, causes the controller to:
    a) obtain a measured signal of an electrical or mechanical parameter concerning the electrical drive system,
    b) obtain a frequency spectrum of the measured signal by means of the Fast Fourier Transform, which frequency spectrum contains a measured frequency component,
    c) determine whether a point in the plane having as its coordinates a value of the measured frequency component and the fundamental frequency of the measured signal is within a predetermined distance from a trend line, which trend line is associated with only one specific frequency component of the electrical or mechanical parameter present during a specific undesired condition, utilising the Mahalanobis distance to determine a distance between the point and the trend line to determine whether the point is within the predetermined distance from the trend line,
    d) on the condition that the point is within the predetermined distance from the trend line, increase a counter associated with the trend line, e) repeat a) to d), wherein in case the counter reaches a predetermined number within a predetermined number of iterations of a) to d), f) determine based on that the counter reaches the predetermined number that harmonic associated with the trend line is present in the measured signal and thereby that the electrical drive system is subjected to the undesired condition associated with the trend line.

7. A computer program product comprising a computer program as claimed in claim 6, and a storage unit on which the computer program is stored.

8. A controller configured to determine an undesired condition in an electrical drive system comprising an electrical machine and an electrical drive wherein the controller comprises:
 a processing unit,
 a storage unit containing computer code, wherein the computer code when run on the processing unit causes the controller to:
 a) obtain a measured signal of an electrical or mechanical parameter concerning the electrical drive system,
 b) obtain a frequency spectrum of the measured signal, which frequency spectrum contains a measured frequency component, wherein the controller is configured to obtain the frequency spectrum by means of the Fast Fourier Transform,
 c) determine whether a point in the plane having as its coordinates a value of the measured frequency component and the fundamental frequency of the measured signal is within a predetermined distance from a trend line which trend line is associated with only one specific harmonic of the electrical or mechanical parameter present during a specific undesired condition,
 d) on the condition that the point is within the predetermined distance from the trend line, increase a counter associated with the trend line,
 e) repeat a) to d), wherein in case the counter reaches a predetermined number within a predetermined number of iterations of a) to d),
 f) determine based on that the counter reaches the predetermined number that the harmonic associated with the trend line is present in the measured signal and thereby that the electrical drive system is subjected to the undesired condition associated with the trend line, wherein the controller is configured to utilise the Mahalanobis distance to determine a distance between the point and the trend line to determine whether the point is within the predetermined distance from the trend line.

9. The controller as claimed in claim 8, wherein the controller is configured to obtain the frequency spectrum by means of a Fast Fourier Transform.

10. The controlleras claimed in claim 8, wherein the trend line is a linear regression trend line created based on theoretically modelled or experimentally measured specific frequency components for a plurality of operational frequencies of the electrical or mechanical parameter.

11. The method as claimed in claim 1, wherein the processing unit is part of an electrical drive controller of the electrical drive system.

* * * * *